(12) United States Patent
Yabe

(10) Patent No.: US 7,460,408 B2
(45) Date of Patent: Dec. 2, 2008

(54) SEMICONDUCTOR MEMORY DEVICE OF SINGLE-BIT-LINE DRIVE TYPE

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 11/538,983

(22) Filed: Oct. 5, 2006

(65) Prior Publication Data

US 2007/0127286 A1    Jun. 7, 2007

(30) Foreign Application Priority Data

Oct. 20, 2005    (JP)    ............................ 2005-305576

(51) Int. Cl.
*G11C 11/34* (2006.01)
(52) U.S. Cl. ........................ 365/185.23; 365/185.18; 365/189.09
(58) Field of Classification Search ............ 365/185.23, 365/185.18, 185.21, 189.09, 154, 230.03, 365/226, 156
See application file for complete search history.

(56) References Cited

U.S. PATENT DOCUMENTS

2005/0232058 A1   10/2005   Yabe

2007/0025140 A1 *   2/2007   Redwine .................... 365/154
2007/0194833 A1 *   8/2007   Takeyama et al. .......... 327/434

OTHER PUBLICATIONS

Kevin Zhang, et al., "The Scaling of Data Sensing Schemes for High Speed Cache Design in Sub-0.18μm Technologies", 2000 Symposium on VLSI Circuits Digest of Technical Papers, IEEE, Jan. 2000, pp. 226-227.

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor memory device includes a plurality of word lines, first and second bit lines, a plurality of memory cells which are connected to the first and second bit lines, a differential amplifier which is connected to one end of the first bit line and one end of the second bit line, a reference-current generating circuit which is connected to the other end of the second bit line and which generates a reference-current smaller than the cell current of the memory cells, and a dummy word line which is connected to the reference-current generating circuit, to activate the reference-current generating circuit in order to read data.

14 Claims, 7 Drawing Sheets

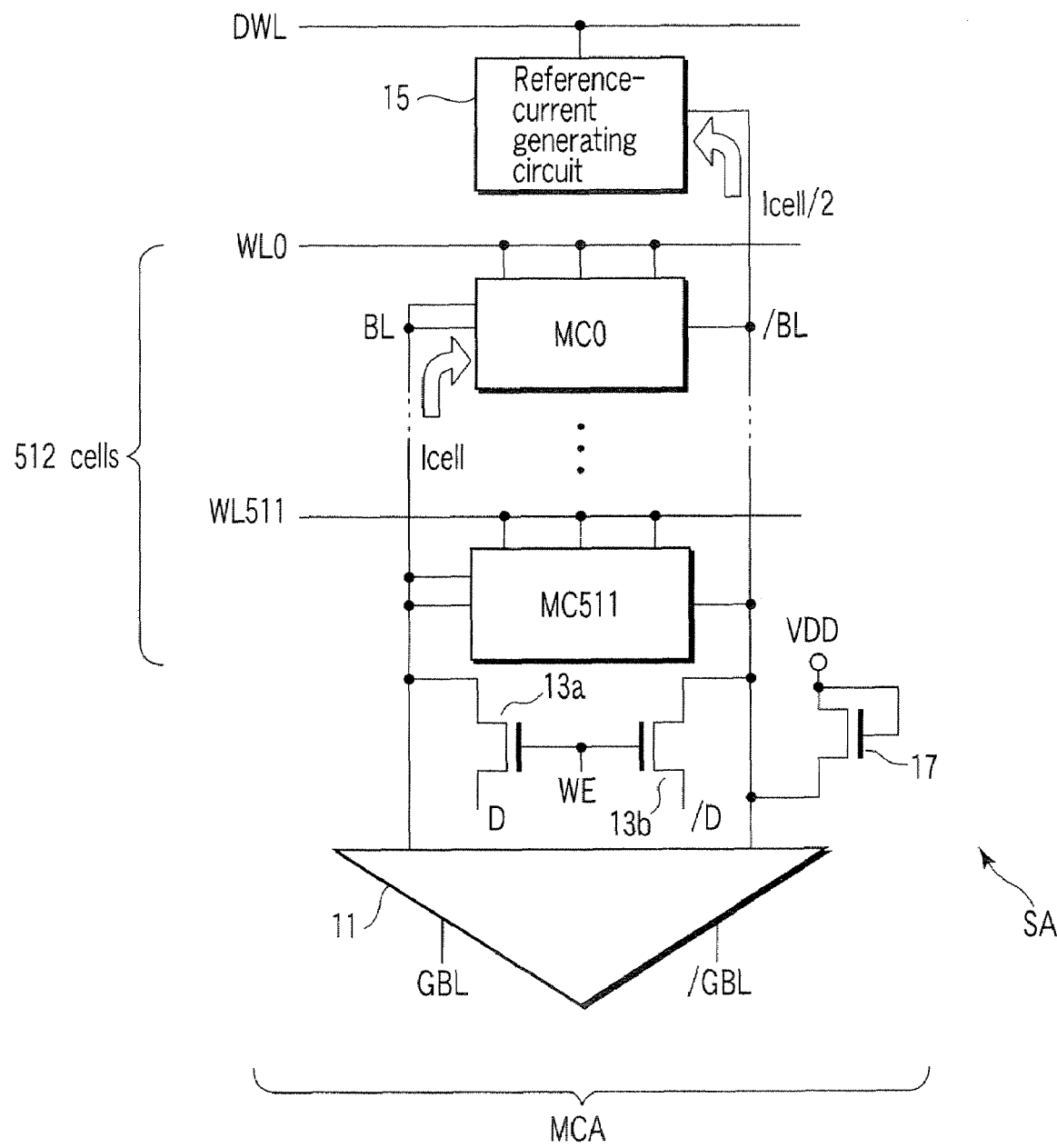
F I G. 1

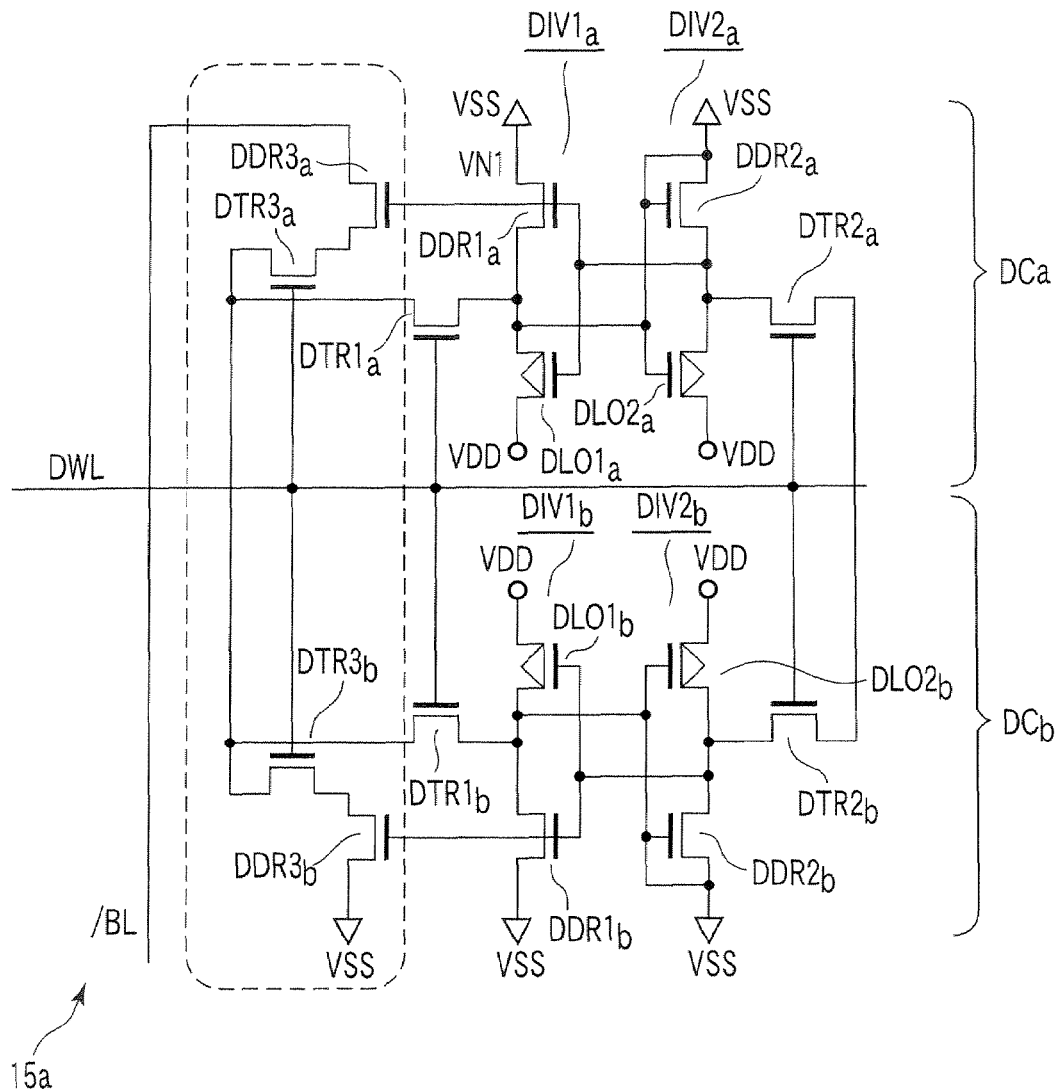
F I G. 6

SEMICONDUCTOR MEMORY DEVICE OF SINGLE-BIT-LINE DRIVE TYPE

CROSS-REFERENCE TO RELATED APPLICATIONS

This application is based upon and claims the benefit of priority from prior Japanese Patent Application No. 2005-305576, filed Oct. 20, 2005, the entire contents of which are incorporated herein by reference.

BACKGROUND OF THE INVENTION

1. Field of the Invention

The present invention relates to a semiconductor memory device. More particularly, the invention relates to a static random access memory (hereinafter referred to as SRAM) of single-bit-line drive type.

2. Description of the Related Art

In recent years, various problems with SRAMs have become obvious as their storage capacity increases and their operating voltage decreases. SRAMs of single-bit-line drive type are known, from which data can be read at high speeds. As such a SRAM, an SRAM of single-ended-bit-line reading type in which cell data is read through bit lines (BLs) only is available (see, for example, K. Zhang et al., "The Scaling of Data Sensing Schemes for High Speed Cache Design in Sub-0.18 m Technologies", Tech. Dig. Of VLSI Circuits Symp. 2000, pp. 226-227, June 2000).

In the SRAM of this type, the potential of the BLs must be fully swung in order to amplify the cell data. To read the data at a high speed, it is important to limit the number of cells connected to each BL to about 32. However, the limitation to the number of cells leads to an increase in the number by which the BL is divided in the memory cell array. This ultimately results in an increase of the chip size.

As indicated above, the number of cells connected to each BL must be limited to achieve high-speed reading of data, in the conventional SRAM of single-ended-bit-line reading type. Consequently, the number by which the BL is divided will increase, ultimately increasing the chip size.

BRIEF SUMMARY OF THE INVENTION

According to a first aspect of the present invention, there is provided a semiconductor memory device comprising a plurality of word lines; first and second bit lines; a plurality of memory cells which are connected to the first and second bit lines, each memory cell having: a first inverter having an input terminal and an output terminal; a second inverter having an input terminal connected to the output terminal of the first inverter, and an output terminal connected to the input terminal of the first inverter; a first transfer-gate transistor having a gate terminal connected to one of the word lines, and a first current path connected at one end to the first bit line and at the other end to at least the output terminal of the first inverter; a second transfer-gate transistor having a gate terminal connected to one of the word lines, and a second current path connected at one end to the second bit line and at the other end to at least the output terminal of the second inverter; a third transfer-gate transistor having a gate terminal connected to one of the word lines, and a third current path connected at one end to the first bit line; and a reading-driver transistor having a gate terminal connected to at least the input terminal of the first inverter, and a fourth current path connected at one end to the other end of the third current path of the third transfer-gate transistor, and at the other end to a first power-supply terminal; a differential amplifier which is connected to one end of the first bit line and one end of the second bit line; a reference-current generating circuit which is connected to the other end of the second bit line and which generates a reference-current smaller than the cell current of the memory cells; and a dummy word line which is connected to the reference-current generating circuit, to activate the reference-current generating circuit in order to read data.

BRIEF DESCRIPTION OF THE SEVERAL VIEWS OF THE DRAWING

FIG. 1 is a configuration diagram showing an example of a memory cell array provided in a SRAM of single-bit-line drive type, according to a first embodiment of this invention;

FIG. 6 is a circuit diagram showing an example of the configuration of the reference-current generating circuit;

DETAILED DESCRIPTION OF THE INVENTION

Figure 2:
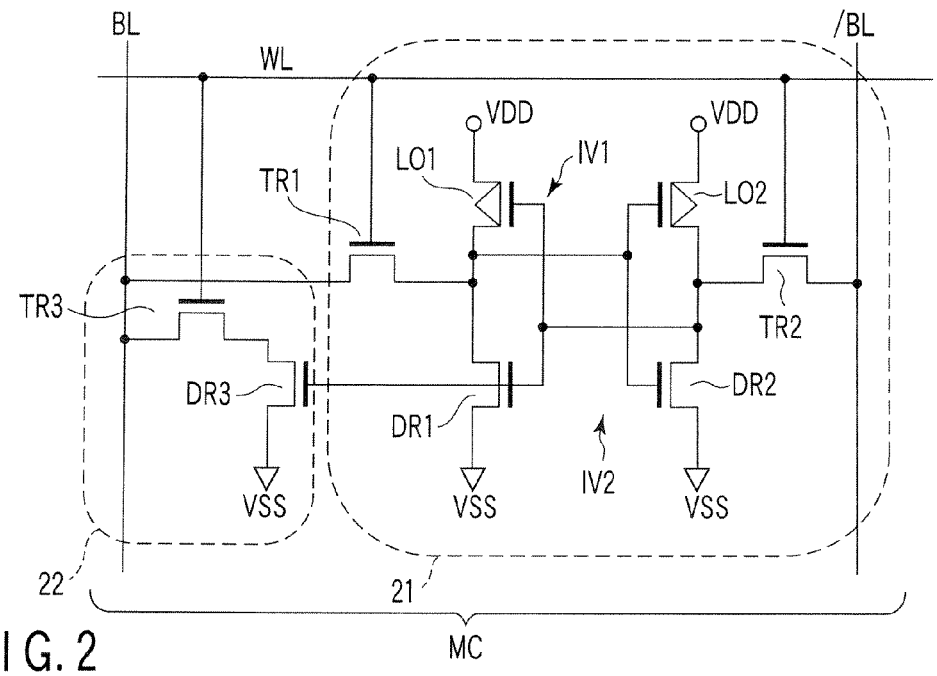
FIG. 2 is a circuit diagram depicting an example of the composition of each cell provided in the memory cell array shown in FIG. 1.

Embodiments of this invention will be described with reference to the accompanying drawings. The drawings schematically show the embodiments. It should be noted that the components shown in the drawings differ from the actual components in size and size ratio. Further, the drawings are different from one another, in size and size ratio.

FIRST EMBODIMENT

FIG. 1 shows the basic configuration of a memory cell array for use in SRAMs (semiconductor memory devices) of single-bit-line drive type, according to the first embodiment of this invention. The memory cell array comprises, for example, 64 sub-arrays. Only one of the sub-arrays is shown in FIG. 1. As FIG. 1 shows, the sub-array has, for example, 12 word lines and a pair of local bit lines.

In this embodiment, the memory cell array MCA has 64 sub-arrays SA. Each sub-array SA has 512 memory cells MC0 to MC511. The memory cells MC0 to MC511 are SRAM cells of single-bit-line drive type, each having eight transistors.

Each of the memory cells MC0 to MC511 comprises a data-holding unit and a reading unit. The data-holding unit has six transistor cells of the conventional type. The reading unit has two N-channel metal oxide semiconductor (MOS) field-effect transistors (hereinafter referred to as NMOS transistors). The reading unit is connected to the bit line BL only. Therefore, the cell data (cell current) is read to the bit line BL only. That is, each memory cell is a so-called single-bit-line drive cell. If another reading unit is connected to the bit line /BL, the cell area will increase.

In each memory cell, the reading unit is separated from the data-holding unit. Hence, the reading unit can have a threshold value Vth that is optimal to the cell current, and the data-holding unit can have a threshold value that is optimal to the static noise margin (hereinafter referred to as SNM). The reading unit has its memory node connected to the gates of the constituent transistors. The reading unit therefore imposes no influence on the data-holding unit. However designed, the reading unit would not adversely influence SNM, i.e., an index of cell stability. In fact, not only a large cell current is attained by setting a low threshold voltage to the reading unit, but also a large SNM is attained by setting a high threshold voltage to the data-holding unit. The cell current is the sum of two currents that the reading unit and the data-holding unit use, respectively, to drive the bit line BL. This helps to ensure a large cell current, too. SRAMs of this type is a breakthrough, because as the cells are made smaller, it is increasingly difficult to design a SRAM having large cell current and high cell stability.

The 512 word lines WL0 to WL511 are connected to the memory cells MC0 to MC511, respectively. A pair of local bit lines BL and /BL (i.e., bit-line pair), which are complementary to each other, are connected to all memory cells MC0 to MC511. The bit lines BL and /BL extend almost at right angles to the word liens WL0 to WL511.

The bit lines BL and /BL are connected at one end to a differential sense amplifier (differential amplifier) 11. A pair of global bit lines GBL and /GBL, which are complementary to each other, are connected to the differential sense amplifier 11. The differential sense amplifier 11 outputs cell data (cell current Icell) to the global bit lines GBL and /GBL. Data lines D and /D, which are complementary to each other, are connected to the bit lines BL and /BL via NMOS transistors 13a and 13b, respectively. A write enable signal WE that rises to high level to write data is supplied to the gates of the NMOS transistors 13a and 13b.

To write data, the write enable signal WE is set to high level. Data is thereby written in the memory cells (selected cells) MC0 to MC511 the word line WL0 to WL511 have selected through the data lines D and /D and the bit lines BL and /BL. Thus, not only bit line BL, but also bit line /BL are driven to write data.

A reference-current generating circuit 15 is connected to the other end of the bit line /BL. The circuit 15 generates a reference current that is half the cell current Icell (Icell/2) so that data may be read from the memory cells MC0 to MC511. A dummy word line DWL is connected to the reference-current generating circuit 15. The dummy word line DWL is provided to activate the reference-current generating circuit 15 to read data from the memory cells MC0 to MC511. A /BL-clamping load circuit (bit-line clamping circuit) 17 that comprises an NMOS transistor is connected to the bit line/ BL. The /BL-clamping load circuit 17 clamps the amplitude of the potential at the bit line /BL to the threshold voltage Vth of the NMOS transistor, thus setting the lower limit to the potential of the bit line /BL during the data-reading period.

In the actual SRAM, 64 sub-arrays are arranged in rows and columns, constituting one memory cell array. Each sub-array has a specific number of memory cells (512 cells in this case).

FIG. 2 shows a memory cell MC, or one of the identical 512 memory cells MC0 to MC511. The memory cell MC comprises data-holding unit (High-Vth) 21 and a reading unit (Low-Vth) 22. The data-holding unit comprises six transistors, and reading unit 22 two NMOS transistors. The data-hold part 21 has a first inverter IV1, a second inverter IV2, a first transfer-gate transistor TR1, and a second transfer-gate transistor TR2. The first inverter IV1 has a first load transistor LO1 and a first driver transistor DR1. The second inverter IV2 has a second load transistor LO2 and a second driver transistor DR2. The reading unit 22 has a third transfer-gate transistor TR3 and a reading-driver transistor DR3.

The first and second load transistor LO1 and LO2 are PMOS transistors. The first and second driver transistor DR1 and DR2 are NMOS transistors. Thus, the first inverter IV1 is a complementary MOS (MCMOS) inverter constituted by the first load transistor (PMOS transistor) LO1 and the first driver transistor (NMOS transistor) DR1. Similarly, the second inverter IV2 is a CMOS inverter constituted by the second load transistor (PMOS transistor) LO2 and the second driver transistor (NMOS transistor) DR2.

The third transfer-gate transistor TR3 or the reading-driver transistor DR3, or both have a threshold voltage Vth lower than that of the first and second transfer-gate transistors TR1 and TR2, that of the first driver transistors DR1 of the first inverter IV1, and that of second driver transistor DR2 of the second inverter IV2. Preferably, the value by which the threshold voltage Vth may change should be set to, for example, 50 mV or more, which is greater than the value by which the threshold voltage of NMOS transistors may change.

The gate terminal of the first transfer-gate transistor TR1 is connected to a word line WL (i.e., WL0, WL1, WL2, . . . or WL511). One of the source and drain terminals of the transistor TR1, i.e., current path, is connected to the bit line BL, and the other of the source and drain terminals of the transistor TR1 is connected to the output terminal of the first inverter IN1 and the input terminal of the second inverter IN2. The gate terminal of the second transfer-gate transistor TR2 is connected to the word line WL. One of the source and drain terminals of the transistor TR2 is connected to the bit line /BL, and the other of the source and drain terminals of the transistor TR2 is connected to the output terminal of the second inverter IV2 and the input terminal of the first inverter IN1.

The gate terminal of the third gate-transistors TR3 is connected to the word line WL. One of the source and drain terminals of the transistor TR3 is connected to bit line BL. The gate terminal of the reading-driver transistor DR3 is connected to the input terminal of the first inverter IV1 and the output terminal of the second inverter IV2. One of the source and drain terminals of the reading-driver transistor DR3 is connected to the other of the source and drain terminals of the third transfer-gate transistor TR3. The other of the source and drain terminals of the DR3 is connected to a first power-supply terminal to which reference potential VSS, such as ground potential, is applied.

A second power-supply terminal, to which a predetermined power-supply voltage VDD is applied, is connected to the source terminal of the first load transistor LO1. The drain terminal of the first driver transistor DR1 is connected to the drain terminal of the first load transistor LO1. One of the source and drain terminals of the first transfer-gate transistor TR1 is connected to the drain terminal of the first load transistor LO1. The first power-supply terminal, to which the reference potential VSS is supplied, is connected to the source terminal of the first driver transistor DR1. The gate terminal of the first load transistor LO1 is connected to the gate terminal of the first driver transistor DR1 and the gate terminal of the reading-driver transistor DR3. The node of the gate terminal of the first load transistor LO1 and the gate terminal of the first driver transistor DR1 is the input terminal the first inverter IV1.

The second power-supply terminal, to which the power-supply voltage VDD is supplied, is connected to the source terminal of the second load transistor LO2. The drain terminal of the second driver transistor DR2 is connected to the drain terminal of the second load transistor LO2. The other of the source and drain terminals of the second transfer-gate transistor TR2 is connected to the drain terminal of the second load transistor LO2. The first power-supply terminal, to which reference potential VSS is supplied, is connected to the source terminal of the second driver transistor DR2. The gate terminal of the second load transistor LO2 is connected to the gate terminal of the second driver transistor DR2. The node of these gate terminals is the input terminal of the second inverter IV2.

Figure 3:
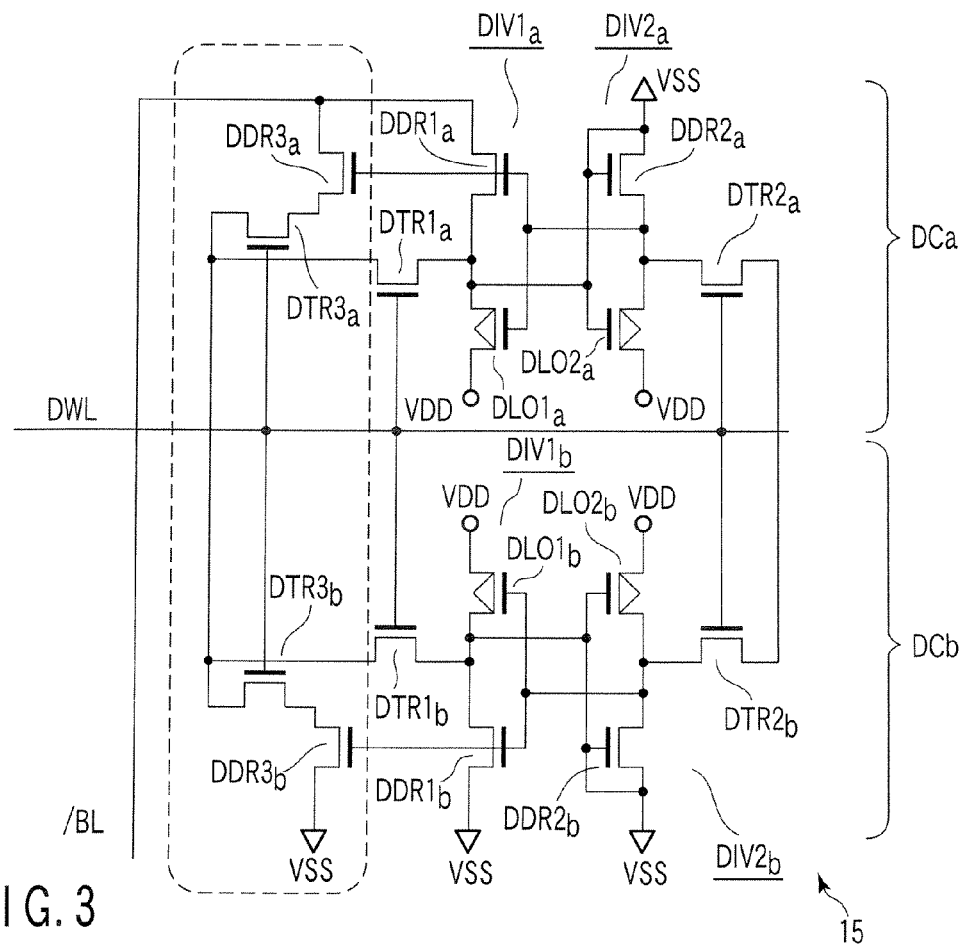
FIG. 3 is a circuit diagram showing an example of the configuration of the reference-current generating circuit incorporated in the SRAM of single-bit-line drive type, shown in FIG. 1.

FIG. 3 shows a configuration that the reference-current generating circuit 15 may have. This embodiment uses a layout for two SRAM cells of single-bit-line drive type, each comprising eight transistors (replica of transistors constituting a memory cell MC). This layout fixes the internal node of each cell. Two groups of transistors (each group consisting of two NMOS transistors) are connected in series between the bit line /BL and the reference potential VSS.

That is, the reference-current generating circuit 15 comprises 16 dummy transistors (for two cells). More precisely, the circuit 15 has two dummy cells DCa and DCb. One dummy cell DCa has a first dummy inverter DIV1a, a second dummy inverter DIV2a, a first dummy transfer-gate transistor (NMOS transistor) DTR1a, a second dummy transfer-gate transistor (NMOS transistor) DTR2a, a third dummy transfer-gate transistor (NMOS transistor) DTR3a, and a dummy reading-driver transistor (NMOS transistor) DDR3a. The first dummy inverter DIV1a has a first dummy load transistor (PMOS transistor) DLO1a and a first dummy driver transistor (NMOS transistor) DDR1a. The second dummy inverter DIV2a has a second dummy load transistor (PMOS transistor) DLO2a and a second dummy driver transistor (NMOS transistor) DDR2a.

The other dummy cell DCb has a first dummy inverter DIV1b, a second dummy inverter DIV2b, a first dummy transfer-gate transistor (NMOS transistor) DTR2b, a third dummy transfer-gate transistor (NMOS transistor) DTR3b, and a dummy reading-driver transistor (NMOS transistor) DDR3b. The first dummy inverter DIV1b has a first dummy load transistor (PMOS transistor) DLO1b and a first dummy driver transistor (NMOS transistor) DDR1b. The second dummy inverter DIV2b has a second dummy load transistor (PMOS transistor) DLO2b and a second dummy driver transistor (NMOS transistor) DDR2b.

In the dummy cell DCa, the gate terminal of the first dummy transfer-gate transistors DTR1a is connected to a dummy word line DWL. One of the source and drain terminals of the first dummy transfer-gate transistor DTR1a is connected one of the source and drain terminals of the third dummy transfer-gate transistor DTR3a. The other of the source and drain terminals of the first dummy transfer-gate transistor DTR1a is connected to the output terminal of the first dummy inverter DIV1a and the input terminal of the second dummy inverter DIV2a.

The gate terminal of the second dummy transfer-gate transistor DTR2a is connected to the dummy word line DWL. One of the source and drain terminals of the transistor DTR2a is connected to the input terminal of the first dummy inverter DIV1a and the output terminal of the second dummy inverter DIV2a.

The gate terminal of the third dummy transfer-gate transistor DTR3a is connected to the dummy word line DWL. One of the source and drain terminals of the transistor DTR3a is connected to one of the source and drain terminals of the first dummy transfer-gate transistors DTR1a. The other of the source and drain terminals of the third dummy transfer-gate transistor DTR3a is connected to one of the source and drain terminals of the dummy reading-driver transistor DDR3a.

The gate terminal of the dummy reading-driver transistor DDR3a is connected to the input terminal of the first dummy inverter DIV1a and the output terminal of the second dummy inverter DIV2a. One of the source and drain terminals of the dummy reading-driver transistor DDR3a is connected to the other of the source and drain terminals of the third dummy transfer-gate transistor DTR3a. The other of the source and drain terminals of the transistor DTR3a is connected to the bit line /BL.

In the first dummy inverter DIV1a, the second power-supply terminal, to which a predetermined supply voltage VDD is supplied, is connected to the source terminal of first dummy load transistor DLO1a, and the drain terminal of the first dummy driver transistor DDR1a is connected to the drain terminal of the transistor DLO1a. The other of the source and drain terminals of the drain terminal of the transistor DLO1a. The source terminal of the first dummy driver transistor DDR1a is connected to the bit line/BL. The gate terminal of the first dummy load transistor DLO1a is connected to the gate terminal of the first dummy driver transistor DDR1a and to the gate terminal of the dummy reading-driver transistor DDR3a.

In the second dummy inverter DIV2a, the second power-supply terminal is connected to the source terminal of the second dummy load transistor DLO2a, and the drain terminal of the second dummy driver transistor DDR2a is connected to the drain terminal of second dummy load transistor DLO2a. One of the source and drain terminals of the second dummy transfer-gate transistors DTR2a is connected to the drain terminal of the second dummy load transistor DLO2a. The first power-supply terminal, to which the reference potential VSS is supplied, is connected to the source terminal of the second dummy driver transistor DDR2a. The gate terminal of the second dummy load transistor DLO2a is connected to the second gate terminal of the dummy driver transistor DDR2a and to the first power-supply terminal. That is, the input terminal of the second dummy inverter DIV2a is connected to the first power-supply terminal, and the internal node is fixed (grounded).

In the other dummy cell DCb, the gate terminal of the first dummy transfer-gate transistors DTR1b is connected to the dummy word line DWL. One of the source and drain terminals of the first dummy transfer-gate transistors DTR is connected to one of the source and drain terminals of the third dummy transfer-gate transistors DTR3b. The other of the either the source and drain terminals of the first dummy transfer-gate transistors DTR1b is connected to the output terminal of the first dummy inverter DIV1b and the input terminal of the second dummy inverter DIV2b.

The gate terminal of the second dummy transfer-gate transistors DTR2b is connected to the dummy word line DWL. One of the source and drain terminals of the transistor DTR2b is connected to the input terminal of the first dummy inverter DIV1b and the output terminal of the second dummy inverter DIV2b.

The gate terminal of the third dummy transfer-gate transistor DTR3b is connected to the dummy word line DWL. One of the source and drain terminals of the transistor DTR3b is connected to one of the source and drain terminals of the first dummy transfer-gate transistors DTR1b. The other of the source and drain terminals of the third dummy transfer-gate transistor DTR3b is connected to one of the source and drain terminals of the dummy reading-driver transistor DDR3b.

The gate terminal of the dummy reading-driver transistor DDR3b is connected to the input terminal of the first dummy inverter DIV1b and the output terminal of the second dummy inverter DIV2b. One of the source and drain terminals of the dummy reading-driver transistor DDR3b is connected to the other of the source and drain terminals of the third dummy transfer-gate transistor DTR3b. The other of the source and drain terminals of the dummy reading-driver transistor DDR3b is connected to the first power-supply terminal.

In the first dummy inverter DIV1b, the second power-supply terminal is connected to the source terminal of first dummy load transistor DLO1b. The drain terminal of the first dummy driver transistor DDR1b is connected to the drain terminal of the transistor DLO1b. The other of the source and drain terminals of the first dummy transfer-gate transistor DTR1b is connected to the drain terminal of the transistor DLO1b. The source terminal of the dummy driver transistor DDR1b is connected to the first power-supply terminal. The gate terminal of the first dummy load transistor DLO1b is connected to the gate terminal of the first dummy driver transistor DDR1b and the gate terminal of dummy reading-driver transistor DDR3b.

In the second dummy inverter DIV2b, the second power-supply terminal is connected to the source terminal of the second dummy load transistor DLO2b. The drain terminal of the second dummy driver transistor DDR2b is connected to the drain terminal of transistor DLO2b. One of the source and drain terminals of the second dummy transfer-gate transistors DTR2b is connected to the drain terminal of transistor DLO2b. The first power-supply terminal is connected to the source terminal of the second dummy driver transistor DDR2b. The gate terminal of the second dummy load transistor DLO2b is connected to the second gate terminal of the dummy driver transistor DDR2b and to the first power-supply terminal. That is, the input terminal of the second dummy inverter DIV2b is connected to the first power-supply terminal, and the inner node is fixed (grounded).

In one dummy cell DCa, one of the source and drain terminals of the first dummy transfer-gate transistor DTR1a is connected to one of the source and drain terminals of the third dummy transfer-gate transistor DTR3a. In the other dummy cell DCa, one of the source and drain terminals of the first dummy transfer-gate transistor DTR1b is connected to one of the source and drain terminals of the third dummy transfer-gate transistor DTR3b. The other of the source and drain terminals of the second dummy transfer-gate transistor DTR2a provided in the dummy cell DCa is connected to the other of the second dummy transfer-gate transistor DTR2b provided in the dummy cell DCb.

As in the memory cells MC described above, at least one of the third dummy transfer-gate transistors DTR3a and DTR3b and at lease one of the reading-driver transistors DRD3a and DDR3b have a lower threshold voltage Vth than the first dummy transfer-gate transistors DTR1a and DTR1b and second dummy transfer-gate transistors DTR2a and DTR2b. (The threshold voltage Vth is lower by, for example, 50 mV or more, than that of the first dummy transfer-gate transistors DTR1a and DTR1b and second dummy transfer-gate transistors DTR2a and DTR2b.)

In this composition, a reference current of Icell/2 will flow from the bit line/BL toward the reference potential VSS when the potential of the dummy word line DWL rises to high level. In other words, the current flows through two paths. The first path extends from the bit line /BL to the reference potential VSS via the first dummy driver transistor DDR1 and first dummy transfer-gate transistor DTR1a of the first dummy inverter DIV1a. The second path extends from the bit line /BL to the reference potential VSS via the reading-driver transistor DDR3a and the third dummy transfer-gate transistor DTR3a. In this case, the series circuit constituted by the MOS transistors (i.e., DDR3a, DTR3a, DTR3b and DDR3b) is twice as high. Hence, the reference current flowing through the first and second paths is about half the cell current Icell.

In this embodiment, the under-layer layout of the SRAM cells is used, fabricating the reference-current generating circuit 15. Hence, the reference current, i.e., Icell/2, can be generated in accordance with the variation of the cell current Icell even if the cell current Icell varies due to changes in the manufacturing process.

Figure 4:
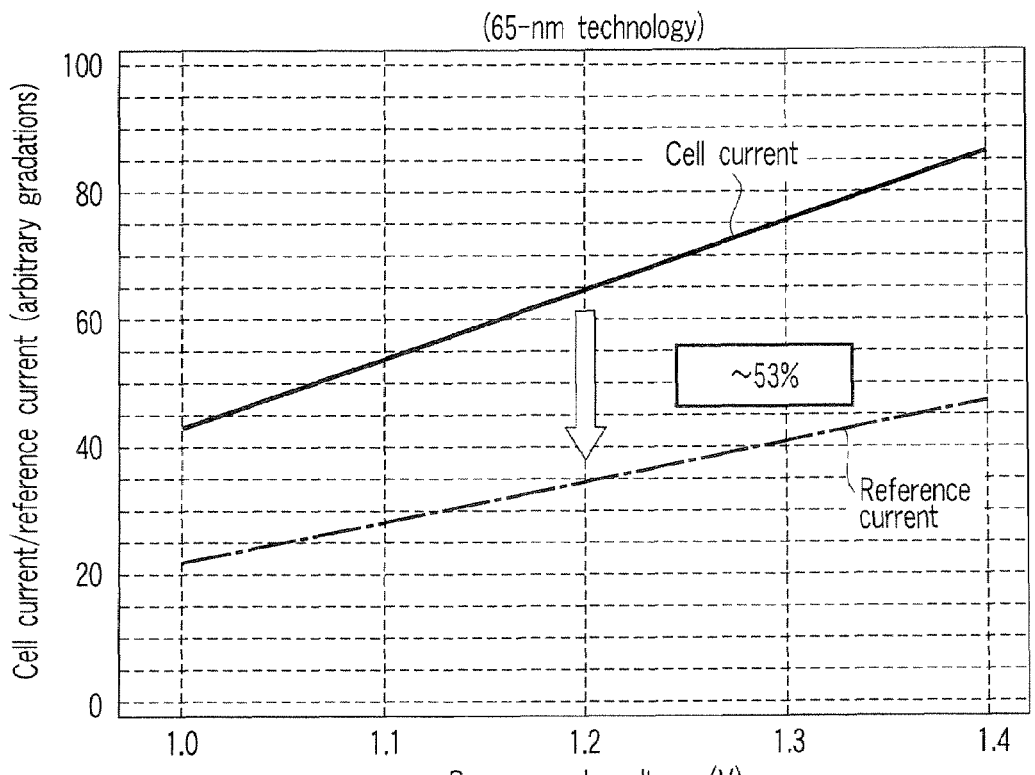
FIG. 4 is a graph representing the relation between the power-supply voltage and the reference current generated by the circuit of FIG. 3, said relation having been obtained by simulation.

FIG. 4 represents the relation between the power-supply voltage and the reference current generated by the circuit of FIG. 3, said relation having been obtained by simulation. The simulation was based on 65 nm technology. As evident from FIG. 4, the reference-current generating circuit 15 can generate a reference current that is about 53% of the cell current, at the power-supply voltage ranging from 1.0 V to 1.4 V.

A method of reading the cell data in the configuration described above will be explained. First, it will be described how to read data "0". When the potential of, for example, the word line WL to which any selected cell is connected rises to high level, the potential of the dummy word line DWL rises to high level. Then, the bit line BL at potential Va1 is discharged because of the cell current Icell flowing in the selected cell, and the bit line /BL at potential Va2 is discharged because of the reference current Icell/2 supplied from the reference-current generating circuit 15.

Assume that the bit line BL and the bit line/BL have the same parasitic capacitance Cb. Then, the potential Va1 of the bit line BL and the potential Va2 of the bit line /BL will fall from the power-supply voltage VDD (i.e., precharge potential of the bit lines BL and /BL) by $\Delta$Va1 and $\Delta$Va2, respectively, upon lapse of delay time $\Delta$t from the activation of the word line WL.

At this time, if $\Delta t < Cb \cdot Vth/Icell$, then:

$$\Delta Va1 = \Delta t \cdot Icell/Cb$$

$$\Delta Va2 = \Delta t \cdot Icell/(2Cb).$$

On the other hand, if $\Delta t \geq Cb \cdot Vth/Icell$, then:

$$\Delta Va1 = \Delta t \cdot Icell/Cb$$

$$\Delta va2 = \Delta t.$$

The differential sense amplifier 11 amplifies potential difference, $\Delta Va1 - \Delta Va2$ ($= \Delta Icell/(2Cb)$), between the bit lines pairs BL and /BL, if $\Delta t < Cb \cdot Vth/Icell$, and outputs data "0" to the global bit lines GBL and /GBL.

Figure 5A:
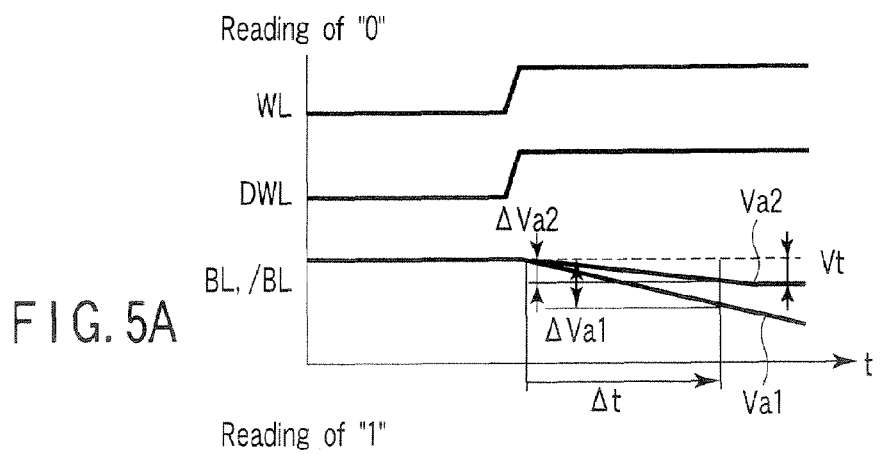
FIGS. 5A and 5B are timing charts explaining a method of reading cell data in the SRAM of single-bit-line drive type, shown in FIG. 1.
Figure 5B:
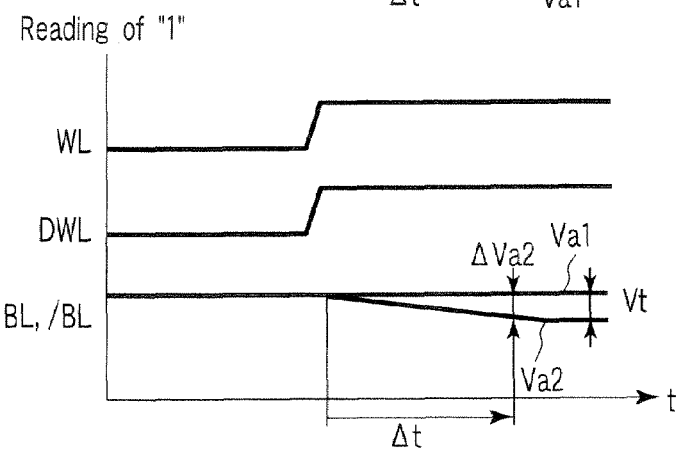

It will be explained how data "1" is read. Assume that the threshold Vth in data-holding unit 21 of memory cell MC is much higher than that of the reading unit 22, and that the drive current that the cell MC supplies to the bit line /BL is negligibly small. Then, as shown in FIG. 5B, the potential Va1 of the bit line BL does not fall, and the power-supply voltage VDD, i.e., precharge potential, remains unchanged. Hence, if $\Delta t < Cb-Vth/Icell$, then:

$Va1=0$ $\Delta Va2 = \Delta t \cdot Icell/(2Cb)$

If $\Delta t \geq CbVth/Icell$, then:

$Va1=0$ $\Delta Va2=Vt$

In this case, the differential sense amplifier 11 amplifies the potential difference $\Delta Va1-\Delta Va2$ ($=-\Delta t$ $-Icell/(2Cb)$) between the bit lines BL and /BL if $\Delta t < Cb-Vth/Icell$. The potential difference amplified is output, as data "1", to the global bit lines GBL and /GBL.

As may be seen from the above, the potential difference between the bit lines BL and /BL remains unchanged, whichever data, "0" or "1", is read, because the reference current is set to Icell/2.

As indicated above, the /BL-clamping load circuit 17 is connected to the bit line/BL. Therefore, the potential of the bit line /BL does not greatly fall to read data "0". This prevents the destruction of the data stored in the memory cell selected.

As described above, the sense amplifier 11 amplifies the potential difference between the bit lines BL and /BL. Hence, it is not necessary to swing the potential of bit line BL fully. More cells can be connected to one bit line than in the conventional memory device. More specifically, about 512 cells at most can be connected to one bit line. This helps to reduce the number of bit lines required. Ultimately, the chip area can be far smaller than that of the conventional memory device.

SECOND EMBODIMENT

FIG. 6 shows the configuration of a reference-current generating circuit 15a according to a second embodiment of the present invention. The circuit 15a differs in configuration from the reference-current generating circuit that is provided in the SRAM (semiconductor memory device) of single-bit-line drive type shown in FIG. 1. This embodiment uses a layout for two SRAM cells of single-bit-line drive type, each comprising eight transistors, too. The internal node of each cell is fixed (grounded). Two groups of transistors (each group consisting of two NMOS transistors) are connected in series between the bit line /BL and the reference potential VSS. The components identical to those shown in FIG. 3 are designated at the same reference numbers and will not be described in detail.

In the reference-current generating circuit 15a, the first dummy driver transistor (NMOS transistor) DDR1a provided in the first dummy inverter DIV1a has its source terminal (VN1) not connected to the bit line /BL. The source terminal (VN1) is connected to the first power-supply terminal to which the reference potential VSS is applied. In this respect, the reference-current generating circuit 15a differs from the reference-current generating circuit 15 (FIG. 3) according to the first embodiment.

In the circuit 15a, a reference current smaller than Icell/2 flows from the bit line/BL to the reference potential VSS when the potential of dummy word line DWL rises to high level. That is, the circuit 15a has no path equivalent to the first path (FIG. 3) that extends from the bit line/BL to the reference potential VSS via the first dummy driver transistor DDR1a and first dummy transfer-gate transistors DTR1a of the first dummy inverter DIV1a. The current therefore flows through the second path only, which extends from the bit line /BL to the reference potential VSS via the reading-driver transistor DDR3a and the third dummy transfer-gate transistor DTR3a. Since the bit line /BL is driven by a current supplied though one path only, the reference current is smaller than Icell/2.

The first embodiment has been described on the assumption that it has a simple structure and that the bit lines BL and /BL have the same parasitic capacitance, so that the process of reading data from any memory cell may be clearly understood. In practice, however, the bit line BL may have capacitance this is greater than that of the bit line /BL, by the junction capacitance of the reading unit 22 (by 20% in the case of 65 nm technology).

In view of this it is desired that the reference current be about 20% smaller than Icell/2, or be about 0.4×Icell. Then, the potential difference between the bit lines BL and /BL of bit line pairs BL/BL would change, whichever data, "0" or "1", is read, while $\Delta Va1$ remains equal to $\Delta Va2$ as shown in FIGS. 5A and 5B.

Figure 7:
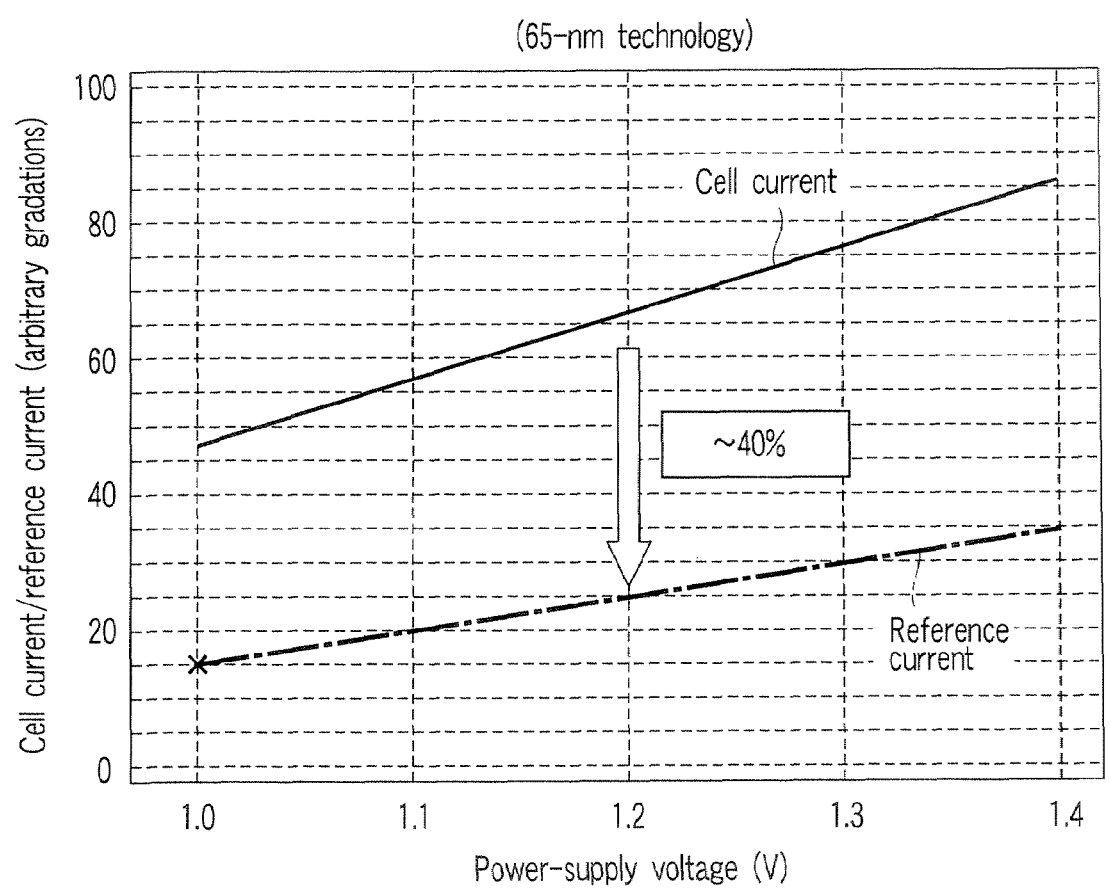
FIG. 7 is a graph representing the relation between the power-supply voltage and the reference current generated by the circuit of FIG. 6, said relation obtained by simulation.

FIG. 7 represents the relation between the power-supply voltage and the reference current generated by the circuit of FIG. 6, said relation having been obtained by simulation. This case is based on 65 nm technology. As seen from FIG. 7, too, the reference-current generating circuit 15a can generates a reference current that is about 40% of the cell current, at the power-supply voltage ranging from 1.0 V to 1.4 V.

In this embodiment, too, the cell current Icell may vary due to changes in the manufacturing process. Nevertheless, a reference current of about 0.4×Icell can be generated in accordance with the variation of the cell current Icell.

Figure 8:
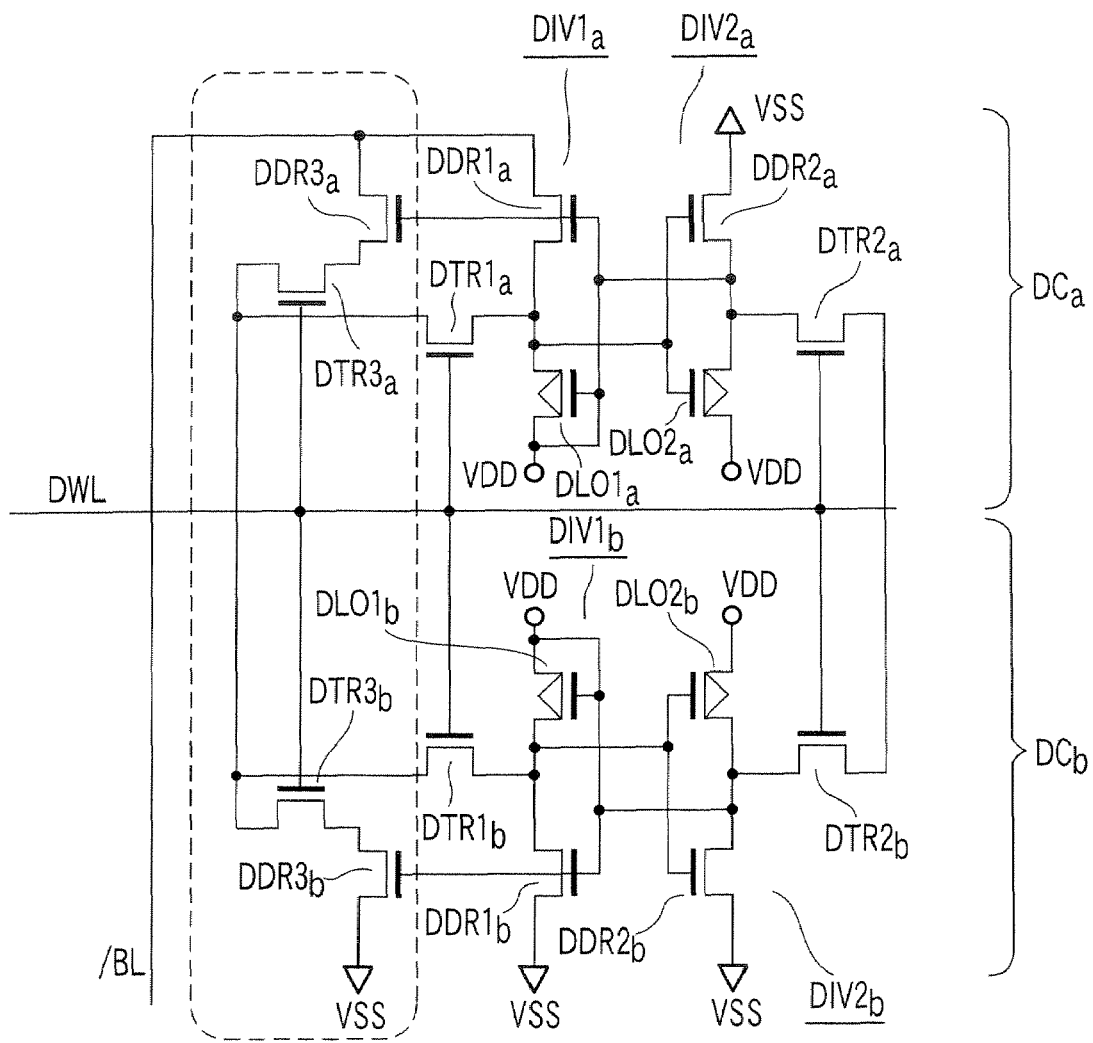
FIG. 8 is a circuit diagram showing another example of the configuration of the reference current-generating circuit shown in FIG. 3.
Figure 9:
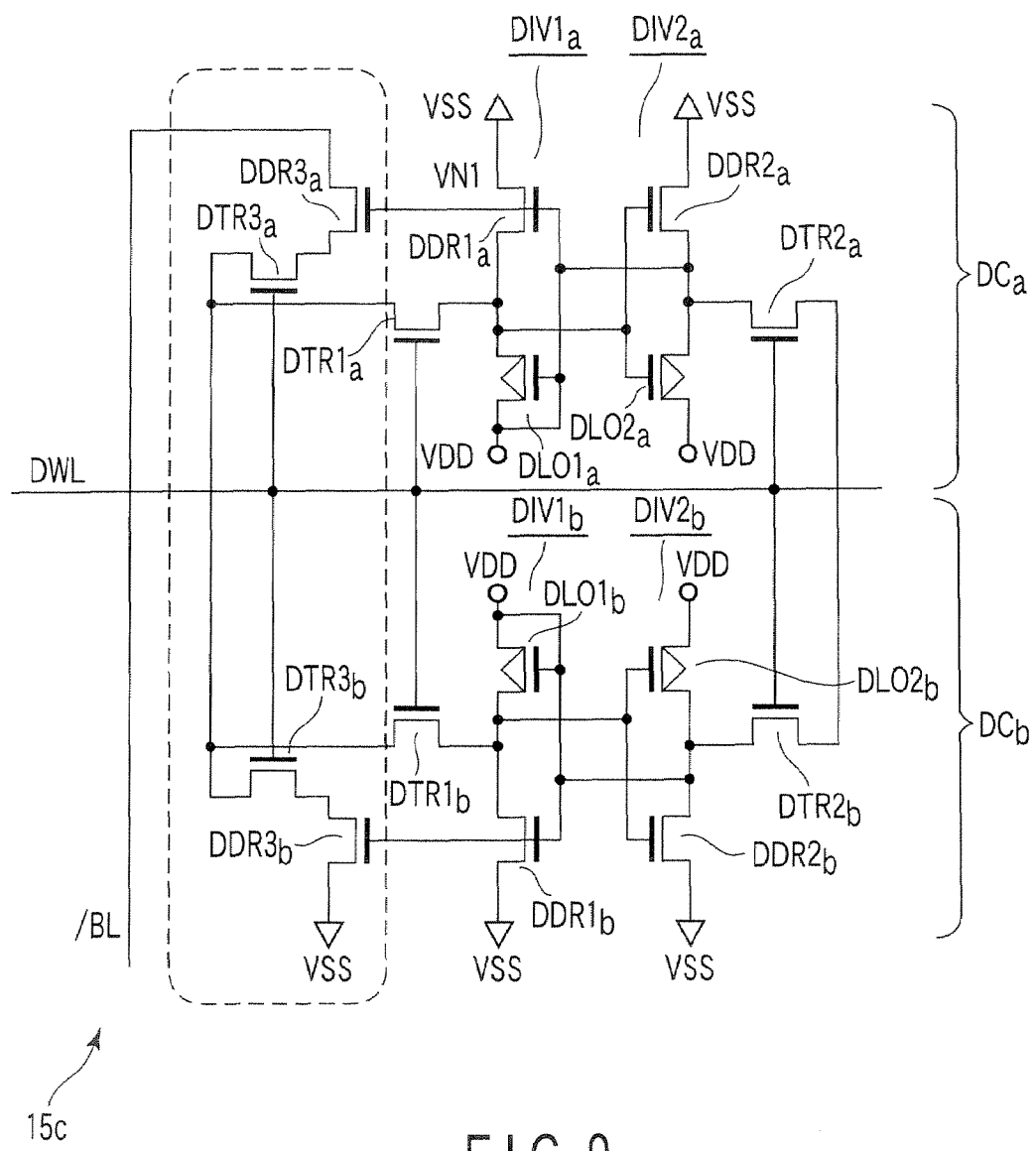
FIG. 9 is a circuit diagram showing another example of the configuration of the reference current-generating circuit shown in FIG. 6.

In both embodiments shown in FIGS. 3 and 6, respectively, the input terminals of the second dummy inverter DIV2a and DIV2b are connected to the first power-supply terminal (VSS). The internal nodes of eth dummy cells DCa and DCb are thereby fixed. This invention is not limited to the embodiments shown in FIGS. 3 and 6. FIGS. 8 and 9 show two reference-current generating circuit 15b and 15c of other types, both according to the present invention. In the circuits 15b and 15c, the input terminals of the second dummy inverter DIV2a and DIV2b are not connected to the first power-supply terminal (VSS), and the input terminals of the first dummy inverter DIV1a and DIV1b (i.e., the gate terminals of the first dummy load transistors DLO1a and DDR1a, and the gate terminals of the first dummy load transistors DLO1b and DDR1b) are connected to the second power-supply terminal (VDD). In this case, too, the internal nodes of the dummy cells DCa and DCb are fixable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of word lines;
   first and second bit lines;
   a plurality of memory cells which are connected to the first and second bit lines, each memory cell having:
      a first inverter having an input terminal and an output terminal;
      a second inverter having an input terminal connected to the output terminal of the first inverter, and an output terminal connected to the input terminal of the first inverter;

a first transfer-gate transistor having a gate terminal connected to one of the word lines, and a first current path connected at one end to the first bit line and at the other end to at least the output terminal of the first inverter;

a second transfer-gate transistor having a gate terminal connected to one of the word lines, and a second current path connected at one end to the second bit line and at the other end to at least the output terminal of the second inverter;

a third transfer-gate transistor having a gate terminal connected to one of the word lines, and a third current path connected at one end to the first bit line; and a reading-driver transistor having a gate terminal connected to at least the input terminal of the first inverter, and a fourth current path connected at one end to the other end of the third current path of the third transfer-gate transistor, and at the other end to a first power-supply terminal;

a differential amplifier which is connected to one end of the first bit line and one end of the second bit line;

a reference-current generating circuit which is connected to the other end of the second bit line and which generates a reference-current smaller than the cell current of the memory cells; and a dummy word line which is connected to the reference-current generating circuit, to activate the reference-current generating circuit in order to read data.

2. The device according to claim 1, wherein the plurality of memory cells are arranged, forming a plurality of sub-arrays, each sub-array consisting of a prescribed number of memory cells, the sub-arrays being arranged in rows and columns, forming one memory cell array.

3. The device according to claim 1, wherein, of the first and second bit lines precharged to a predetermined power-supply voltage before data is read, the second bit line is connected to a bit-line clamping circuit which defines a lower limit of the potential of the second bit line in order to read data.

4. The device according to claim 1, wherein the first and second inverters are CMOS (Complementary Metal Oxide Semiconductor) inverter, each comprising an N-channel MOS field-effect transistor and a P-channel MOS field-effect transistor, and the first, second and third transfer-gate transistors and the reading-driver transistor are N-channel MOS field-effect transistors.

5. The device according to claim 1, wherein, in each of the memory cells, the first and second transfer-gate transistors and the first and second inverters constitute a data-holding unit, the third transfer-gate transistor and the reading-driver transistor constitute a data-reading unit, and at least one of the third transfer-gate transistor and reading-driver transistor has a lower threshold voltage than the first and second transfer-gate transistors and N-channel MOS field-effect transistors which constitute the first and second inverters.

6. The device according to claim 1, wherein the reference-current generating circuit generates a reference current that is not more than half the cell current.

7. The device according to claim 1, wherein the reference-current generating circuit comprise transistors forming two memory cells.

8. The device according to claim 1, wherein the reference-current generating circuit has a first dummy cell and a second dummy cell; the first dummy cell includes a first dummy inverter having an input terminal and an output terminal, a second dummy inverter having an input terminal connected to the output terminal of the first dummy inverter and an output terminal connected to the input terminal of the first dummy inverter, a first dummy transfer-gate transistor having a gate terminal connected to the dummy word line and a first current path connected at one end to at least the output terminal of the first dummy inverter, a second dummy transfer-gate transistor having a gate terminal connected to the dummy word line and a second current path connected at one end to at least the output terminal of the second dummy inverter, a third dummy transfer-gate transistor having a gate terminal connected to the dummy word line, and a first dummy reading-driver transistor having a gate terminal connected to at least the input terminal of the first dummy inverter and a fourth current path connected, at one end, to the other end of a third current path of the third dummy transfer-gate transistor and, at the other end, to the second bit line; and the second dummy cell includes a third dummy inverter having an input terminal and an output terminal, a fourth dummy inverter having an input terminal connected to the output terminal of the third dummy inverter and an output terminal connected to the input terminal of the third dummy inverter, a fourth dummy transfer-gate transistor having a gate terminal connected to the dummy word line and a fifth current path connected at one end to at least the output terminal of the third dummy inverter, a fifth dummy transfer-gate transistor having a gate terminal connected to the dummy word line and a sixth current path connected at one end to at least the output terminal of the fourth dummy inverter, a sixth dummy transfer-gate transistor having a gate terminal connected to the dummy word line, and a second dummy reading-driver transistor having a gate terminal connected to at least the input terminal of the third dummy inverter and an eighth current path connected, at one end, to the other end of a seventh current path of the sixth dummy transfer-gate transistor and, at the other end, to the first power-supply terminal.

9. The device according to claim 8, wherein, in the reference-current generating circuit, the second dummy inverter and the fourth dummy inverter are connected at input terminal to the first power-supply terminal, the first and second dummy cells have internal nodes fixed at a reference potential, and the N-channel MOS field-effect transistors constituting the first dummy inverter are connected at source terminal to the second bit line.

10. The device according to claim 8, wherein, in the reference-current generating circuit, the second dummy inverter and the fourth dummy inverter are connected at input terminal to the first power-supply terminal, the first and second dummy cells have internal nodes fixed at a reference potential, and the N-channel MOS field-effect transistors constituting the first dummy inverter are connected at source terminal to the first power-supply terminal.

11. The device according to claim 8, wherein, in the reference-current generating circuit, the first dummy inverter and the third dummy inverter are connected at input terminal to a second power-supply terminal, the first and second dummy cells have internal nodes fixed to a power-supply voltage, and the N-channel MOS field-effect transistors constituting the first dummy inverter are connected at source terminal to the second bit line.

12. The device according to claim 8, wherein, in the reference-current generating circuit, the first dummy inverter and the third dummy inverter are connected at input terminal to a second power-supply terminal, the first and second dummy cells have internal nodes fixed at a power-supply voltage, and the N-channel MOS field-effect transistors constituting the first dummy inverter are connected at source terminal to the first power-supply terminal.

13. The device according to claim 8, wherein, in the reference-current generating circuit, the second current path of the second dummy transfer-gate transistor and the sixth current path of the fifth dummy transfer-gate transistor are connected at the other end to each other.

14. The device according to claim 8, wherein, in the reference-current generating circuit, the third current path of the third dummy transfer-gate transistor and the seventh current path of the sixth dummy transfer-gate transistor are connected at one end to each other.

* * * * *